(12) United States Patent
Schubert et al.

(10) Patent No.: US 11,929,742 B2
(45) Date of Patent: Mar. 12, 2024

(54) METHOD AND DEVICE FOR SWITCHING AN ELECTRONIC COMPONENT ON OR OFF

(71) Applicant: VITESCO TECHNOLOIGES GERMANY GMBH, Hannover (DE)

(72) Inventors: Goeran Schubert, Schwabach (DE); Andreas Pschorr, Regensburg (DE); Diego Antongirolami, Nuremberg (DE); Ulrich Bley, Rackwitz (DE)

(73) Assignee: Vitesco Technologies Germany GmbH, Hannover (DE)

( * ) Notice: Subject to any disclaimer, the term of this patent is extended or adjusted under 35 U.S.C. 154(b) by 882 days.

(21) Appl. No.: 14/759,051

(22) PCT Filed: Apr. 23, 2014

(86) PCT No.: PCT/EP2014/058266
§ 371 (c)(1),
(2) Date: Jul. 2, 2015

(87) PCT Pub. No.: WO2014/173969
PCT Pub. Date: Oct. 30, 2014

(65) Prior Publication Data
US 2015/0349772 A1 Dec. 3, 2015

(30) Foreign Application Priority Data

Apr. 26, 2013 (EP) .................................... 13002217
Jun. 13, 2013 (EP) .................................... 13171910
Sep. 24, 2013 (DE) .................... 10 2013 219 167.7

(51) Int. Cl.
*H03K 17/687* (2006.01)
*H03K 17/0412* (2006.01)
(Continued)

(52) U.S. Cl.
CPC ..... *H03K 17/687* (2013.01); *H03K 17/04123* (2013.01); *H03K 17/04206* (2013.01);
(Continued)

(58) Field of Classification Search
CPC .. H03K 17/133; H03K 17/687; H03K 17/567; H03K 2217/009
See application file for complete search history.

(56) References Cited

U.S. PATENT DOCUMENTS 7,906,949 B1  3/2011  Sutardja et al.
8,411,468 B2 * 4/2013  Lalithambika .......... H02M 1/08
                                                              363/21.02
(Continued)

FOREIGN PATENT DOCUMENTS

DE   10137752 C1   12/2002
DE   10217611 A1   11/2003
(Continued)

OTHER PUBLICATIONS

Lan Dang, et al.: "Digital adaptive driving strategies for high-voltage IGBTs," Energy Conversion Congress and Exposition (ECCE), 2011 IEEE, IEEE, Sep. 17, 2011 (Sep. 17, 2011), pp. 2993-2999, XP032067565,, DOI: 10.1109/ECCE.2011.6064172; ISBN: 978-1-4577-0542-7.

*Primary Examiner* — Ryan Johnson
*Assistant Examiner* — Colleen J O Toole
(74) *Attorney, Agent, or Firm* — Laurence A. Greenberg; Werner H. Stemer; Ralph E. Locher

(57) ABSTRACT

An electronic component is switched under the control of a pulse-width modulation signal. The electronic component outputs an output signal that is controlled by a control signal. The switching on or off is initiated within a pulse-width modulation cycle period at a level change time by a change of the pulse-width modulation signal. The control signal is (Continued)

set within each PWM cycle period to a first control value between the level change time and a first switching time, to a second control value between the first switching time and a second switching time, and to a third control value from the second switching time until a final gate-voltage value is reached on the gate of the electronic component. Each switching time of a PWM period is determined in dependence on an amplitude value determined during a preceding PWM cycle period, to limit amplitudes of the oscillation of the output signal.

18 Claims, 13 Drawing Sheets

(51) Int. Cl.
*H03K 17/042* (2006.01)
*H03K 17/16* (2006.01)
*H03K 17/567* (2006.01)

(52) U.S. Cl.
CPC ......... *H03K 17/163* (2013.01); *H03K 17/166* (2013.01); *H03K 17/567* (2013.01)

(56) References Cited

U.S. PATENT DOCUMENTS

2005/0104650 A1    5/2005   Feldtkeller
2010/0327946 A1   12/2010   Barrenscheen

FOREIGN PATENT DOCUMENTS

| DE | 10346307 B3 | 12/2004 |
| DE | 102009046255 A1 | 5/2010 |
| JP | 2005278274 A | 10/2005 |

* cited by examiner

METHOD AND DEVICE FOR SWITCHING AN ELECTRONIC COMPONENT ON OR OFF

The invention relates to a method and to a device for switching an electronic component on or off under the control of a pulse-width-modulation signal.

BACKGROUND OF THE INVENTION

Field of the Invention

Inductive electrical loads such as DC motors, in particular brushless DC motors, are often controlled by means of pulse-width-modulation (PWM) in order to adjust an electric current and/or an electric voltage for the respective electrical load. For this purpose, an electrical load is often coupled in a resonant full-bridge or half-bridge circuit to electronic components such as metal-oxide semiconductor field-effect transistors (MOSFETs) or insulated-gate bipolar transistors (IGBTs) which are switched on and off under the control of the PWM signal and, as a result, adjust the current and/or the voltage for the electrical load. When electronic components such as this are switched on and off, undesired parasitic oscillations of the current and the voltage, which can negatively affect the electromagnetic compatibility of the circuit and cause switching losses, can occur.

In order to reduce parasitic oscillations such as these, external capacitors, for example, are connected to the gate and source or drain of the electronic components, gate resistors are used to reduce rates of change of the gate current and the gate voltage or suppressor circuits are used for oscillation damping. However, electrical components such as these lengthen the switching times and increase the switching losses, switching delays and manufacturing costs. Furthermore, high-speed electronic components for adapting the output current or the output voltage to gate-source or drain-source voltages of electronic components are available, but are costly, however.

BRIEF SUMMARY OF THE INVENTION

One problem addressed by the invention is to specify a method for switching an electronic component on or off under the control of a pulse-width-modulation signal, which leads to a reduction in parasitic oscillations. Another problem addressed by the invention is to specify a device for performing the method.

The problem is solved according to the invention by the claimed method and by the claimed device.

Advantageous configurations of the invention are the subject matter of the dependent claims.

The method according to the invention is used to switch an electronic component on or off under the control of a PWM signal (=pulse-width-modulation signal), which electronic component is designed to output an output signal which can be controlled by means of a control signal. In this case, the switching on or off is initiated within a PWM clock period (=clock period of the pulse-width modulation) at a level-change instant by a change in the PWM signal. At least one amplitude magnitude of an oscillation of the output signal is calculated during each clock period of the PWM signal. Furthermore, at least one first control value and one second control value of the control signal are predefined, and the control signal is adjusted to the first control value within each PWM clock period between the level-change instant and a first switchover instant and is adjusted to the second control value between the first switchover instant and a second switchover instant and is adjusted to a third control value from the second switchover instant until a gate voltage end value of a gate voltage at a control connection of the electronic component is reached. In this case, each switchover instant of a PWM clock period is determined on the basis of an amplitude magnitude which is assigned to said PWM clock period and is calculated during a preceding PWM clock period, such that oscillation amplitudes of the oscillation of the output signal are limited.

Therefore, in the case of the method, the control signal for switching the electronic component on or off is modified after a PWM level change, which initiates the switching on or off, on the basis of the oscillation of the output signal. For this purpose, at least two controls values to which the control signal is successively adjusted are used. Whereas said control values are fixedly predefined, the time intervals, in which the control signal is adjusted to the respective control values, for each PWM clock period are varied by adjustment of the switchover instants which limit said intervals such that oscillation amplitudes of the oscillation of the output signal are limited.

The method can therefore be construed as a modified pulse-width-modulation of the control signal, in the case of which modulation the control signal assumes not only two different values in one PWM clock period, like a conventional PWM signal, but assumes at least three different values. In this case, the instants at which the control signal is changed are adapted for each PWM clock period to the oscillation of the output signal in a preceding PWM clock period in order to limit the oscillation of the output signal. Owing to said adjustment of the control signal to detected oscillations of the output signal, the oscillation of the output signal can be influenced and limited in a simple and effective manner.

A preferred configuration of the invention provides that, in addition to the first control value and the second control value, a third control value of the control signal is predefined and the control signal is adjusted to the third control value after the second switchover instant in each PWM clock period.

Owing to said use of another control value, the control signal can be adapted in an even better and more flexible manner to the detected oscillations of the output signal for the purpose of reducing the oscillation of the output signal.

Another configuration of the invention provides that a maximum amplitude value of oscillation amplitudes, which are detected within a time window, of the oscillation of the output signal is calculated as amplitude magnitude. An alternative configuration thereto provides that an integral value of absolute values, which are detected within a time window, of oscillation signals of the oscillation of the output signal is calculated as amplitude magnitude.

Said configurations each provide a different amplitude magnitude. The two amplitude magnitudes are suitable as a measure for the strength of the oscillation of the output signal and therefore enable quantitative evaluation of the oscillation in order to effectively reduce and limit the oscillation.

Another configuration of the invention provides that the first switchover instant of a PWM clock period is determined on the basis of an amplitude magnitude of the oscillation of the output signal in a first time window, wherein the first time window extends from the level-change instant to the second switchover instant of the preceding PWM clock period.

Another configuration of the invention correspondingly provides that the second switchover instant of a PWM clock period is determined on the basis of an amplitude magnitude of the oscillation of the output signal in a second time window, wherein the second time window extends from the second switchover instant of the preceding PWM clock period to a subsequent level change of the PWM signal or until the gate voltage end value at the control connection of the electronic component is reached.

Said two configurations of the invention assign the oscillations evaluated at a determination of a switchover instant to the respective switchover instant and hence also to the associated control value. This advantageously enables a finer adjustment of the control signal to the oscillation of the output signal.

Another configuration of the invention provides that an amplitude limit and a first limit value are predefined, and that the first switchover instant of a PWM clock period is shifted with respect to a preceding PWM clock period in the direction of the PWM clock period end if the amplitude magnitude assigned to the first switchover instant is smaller than the amplitude limit, and is shifted in the direction of the PWM clock period start if the amplitude magnitude assigned to the first switchover instant is greater than the amplitude limit, and the first limit value is not undershot by the shift of the first switchover instant.

Another corresponding configuration of the invention provides that an amplitude limit and a second limit value are predefined, and that the second switchover instant of a PWM clock period is shifted with respect to a preceding PWM clock period in the direction of the PWM clock period start if the amplitude magnitude assigned to the second switchover instant is smaller than the amplitude limit, and is shifted in the direction of the PWM clock period end if the amplitude magnitude assigned to the second switchover instant is greater than the amplitude limit, and the second limit value is not exceeded by the shift of the second switchover instant.

Said two configurations of the invention advantageously enable closed-loop control of the control signal which counteracts oscillation of the output signal and limits the oscillation by appropriately changing the switchover instants of the individual PWM clock periods. In this case, the limit values are each used to limit the shift of a switchover instant. As a result of this, it is advantageously possible, by suitable selection of the limit values, to prevent the switchover instants being shifted so far that they prevent the switching on or off of the electronic component.

Furthermore, a gate current or a rate of change of a gate voltage of a control connection of the electronic component is preferably controlled using the control signal.

As a result of this, in particular, electronic components such as a MOSFET or an IGBT can advantageously be controlled.

A control device according to the invention for performing the method according to the invention comprises at least one oscillation detector for calculating an amplitude magnitude, a control unit for determining the switchover instants and generating the control signal and a signal generator for controlling the electronic component in accordance with the control signal.

A control device such as this is advantageously suitable for performing the method according to the invention having the advantages stated above.

The control device also preferably has a first closed-loop control circuit for controlling the first switchover instant of the control signal on the basis of an amplitude magnitude, which comprises an oscillation detector for calculating the amplitude magnitude, a first closed-loop controller for forming a first correction value, which is a measure for a deviation of the amplitude magnitude from an amplitude limit, and a first output unit, which determines the first switchover instant of each PWM clock period on the basis of the first correction value and changes its output at the first switchover instant to generate the control signal.

Correspondingly, the control device preferably has a second closed-loop control circuit for controlling the second switchover instant of the control signal on the basis of an amplitude magnitude, comprising an oscillation detector for detecting the amplitude magnitude, a second closed-loop controller for forming a second correction value, which is a measure for a deviation of the amplitude magnitude from an amplitude limit, and a second output unit, which determines the second switchover instant of each PWM clock period on the basis of the second correction value and changes its output at the second switchover instant to generate the control signal.

Closed-loop control circuits such as these advantageously enable the abovementioned closed-loop control of the control signal, in the case of which the switchover instants of the individual PWM clock periods are shifted such that the shifting thereof counteracts an oscillation of the output signal and limits the oscillation.

Preferably, each oscillation detector also comprises an amplitude detector and an evaluation member, wherein the amplitude detector detects oscillation amplitudes of an oscillation of the output signal and the evaluation member is designed as a sample-and-hold member for calculating a maximum amplitude or as an integrator for integration of the oscillation amplitudes detected by the amplitude detector.

This design of an oscillation detector makes it possible to use the maximum amplitude or the integral value as amplitude magnitude having the advantages stated above.

In this case, the oscillation detector further preferably has a filter connected upstream of the amplitude detector for extracting an oscillation signal from the output signal.

As a result of this, the component of the output signal which is not necessary for calculating the amplitude magnitude is removed from said output signal. This advantageously facilitates the evaluation of the oscillation of the output signal and the calculation of the amplitude magnitude.

The method and the device according to the invention are particularly suitable and provided for reducing electrical oscillations in a resonant electric circuit with an electronic component which is designed to output an output signal which can be controlled by means of a control signal.

BRIEF DESCRIPTION OF THE SEVERAL VIEWS OF THE DRAWING

Further details and exemplary embodiments of the invention are explained in more detail below with reference to drawings, in which.

Parts which correspond to one another are provided with identical reference signs in all of the figures.

DESCRIPTION OF THE INVENTION

Figure 1:
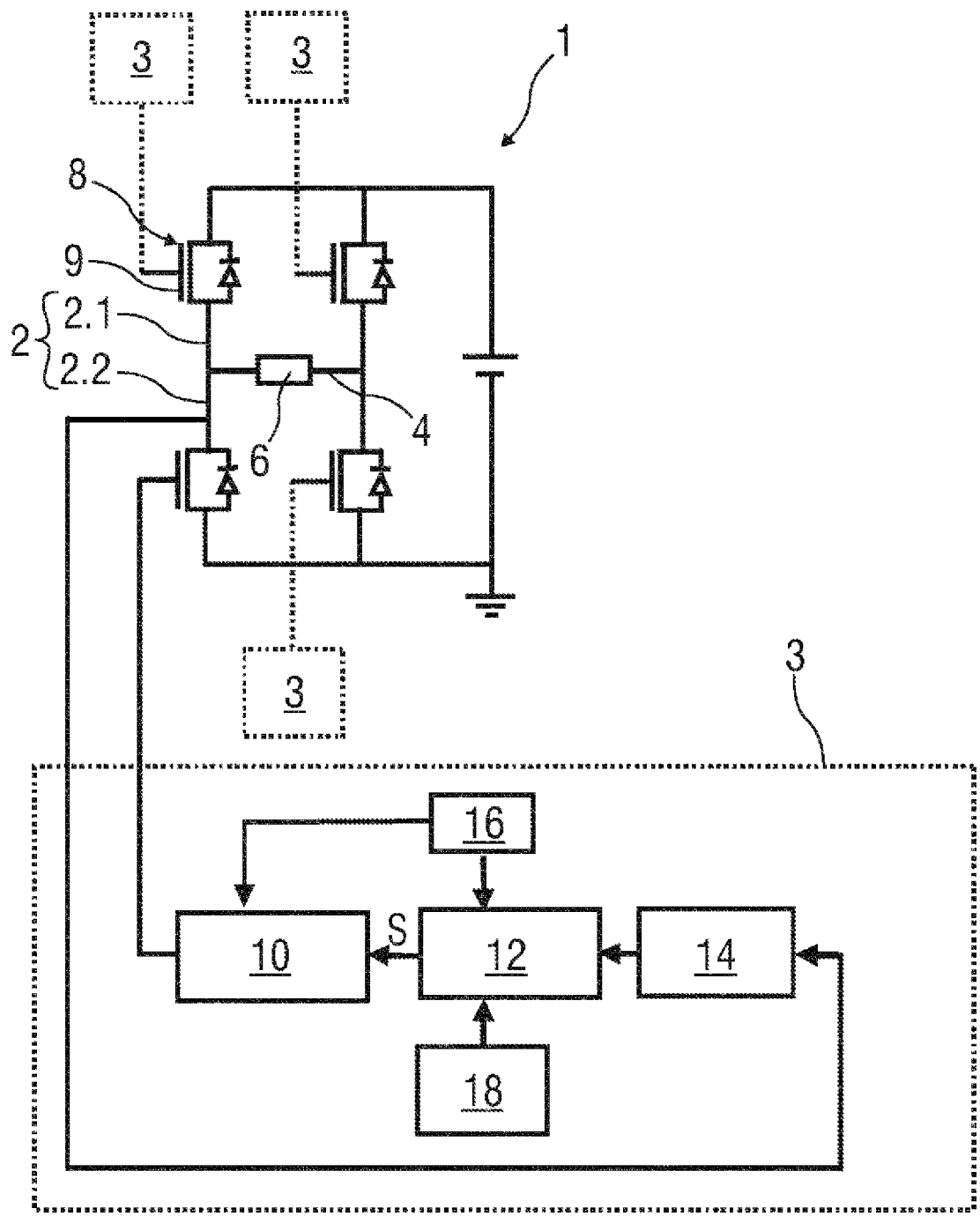
FIG. 1 schematically shows a resonant electric circuit with four control devices for reducing electrical oscillations.

FIG. 1 shows schematically and by way of example a resonant electric circuit 1 with four control devices 3 according to the invention for reducing electrical oscillations. The circuit 1 is designed as an H-bridge circuit with two outer branches 2, which are connected in parallel with one another, and a bridge branch 4, wherein the bridge branch 4 connects the two outer branches 2 to one another and divides each outer branch 2 into two partial branches 2.1, 2.2. There is an electrical load 6 in the bridge branch 4. An electronic component 8, which is designed to output an output signal VDS which can be controlled by means of a control signal S and, for this purpose, has a control connection (gate) 9, is found in each partial branch 2.1, 2.2 of each outer branch 2.

Each electronic component 8 is designed as a MOSFET (metal-oxide semiconductor field-effect transistor) in the exemplary embodiment illustrated in FIG. 1. The control signal S in this case controls a gate current Ig at the gate 9 of the MOSFET or, alternatively, a rate of change of the gate voltage Vg' (temporal derivation) of a gate voltage Vg between gate 9 and source or a gate potential at the gate 9 of the MOSFET. The output signal VDS is in this case a drain-source voltage between drain and source of the MOSFET.

Alternatively, instead of a MOSFET, an IGBT (insulated-gate bipolar transistor) can also be used as electronic component 8 with corresponding control signal S and output signal VDS.

An electric current through the electrical load 6 and/or an electric voltage present across the electrical load 6 are/is controlled via the output signals VDS of the electronic component 8. For this purpose, the electronic components 8 are switched on and off by means of pulse-width modulation (PWM).

Each electronic component 8 is connected to a control device 3 according to the invention for reducing electrical oscillations. Each of said control devices 3 has a signal generator 10, a control unit 12 and at least one oscillation detector 14.

Amplitude magnitudes of oscillations of the output signal VDS of the respective electronic component 8 are detected by means of an oscillation detector 14, wherein an amplitude magnitude is a measure for amounts of oscillation amplitudes of the oscillations (see below). The oscillation detector 14 does not necessarily need to be directly connected to the output of the electronic component 8 in this case since the oscillation caused by the output signal VDS can also be tapped at other suitable points of the circuit 1.

The control unit 12 determines the control signals S on the basis of the detected amplitude magnitudes and a PWM signal 16 which is supplied to said control unit in the manner described below using an amplitude limit 18, wherein the amplitude limit 18 is predefined.

The signal generator 10 controls the electronic component 8 according to the control signal S determined by the control unit 12, that is to say it generates, in this exemplary embodiment, the gate current Ig which corresponds to the control signal S or the rate of change of the gate voltage Vg' which corresponds to the control signal S at the gate 9 of the respective MOSFET. In the event that the control signal S controls the gate current Ig, the signal generator 10 is designed as a voltage-controlled current source. In the event that the control signal S controls the rate of change of the gate voltage Vg', the signal generator 10 is designed as a voltage-controlled voltage source.

Figure 2:
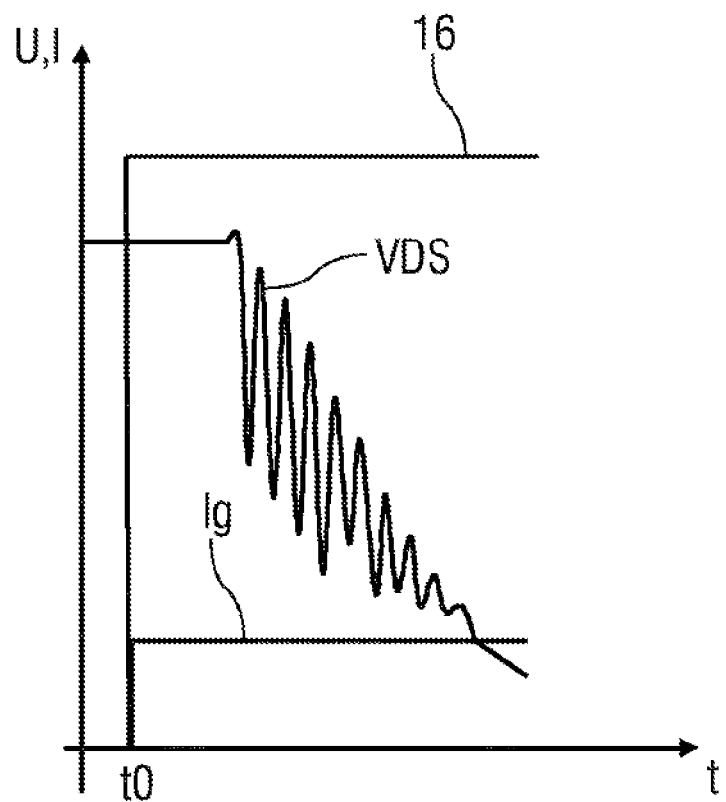
FIG. 2 shows an electronic component being switched on according to the prior art.

FIG. 2 shows an electronic component 8 according to the prior art being switched on, using a graph for profiles of electric voltages U and currents I as a function of time t. The switching on is controlled by a level change in a PWM signal 16, wherein the PWM signal 16 changes at a level-change instant t0 from a lower level to an upper level. After the level-change instant t0, the gate current Ig changes from zero to a value which is subsequently kept constant. As a result of the switching on of the constant gate current Ig, the output signal VDS falls in a time-delayed and oscillating manner. Oscillations of this type can be reduced by, for example, the gate current Ig being reduced, which leads to a longer switchover time, however.

Figure 3:
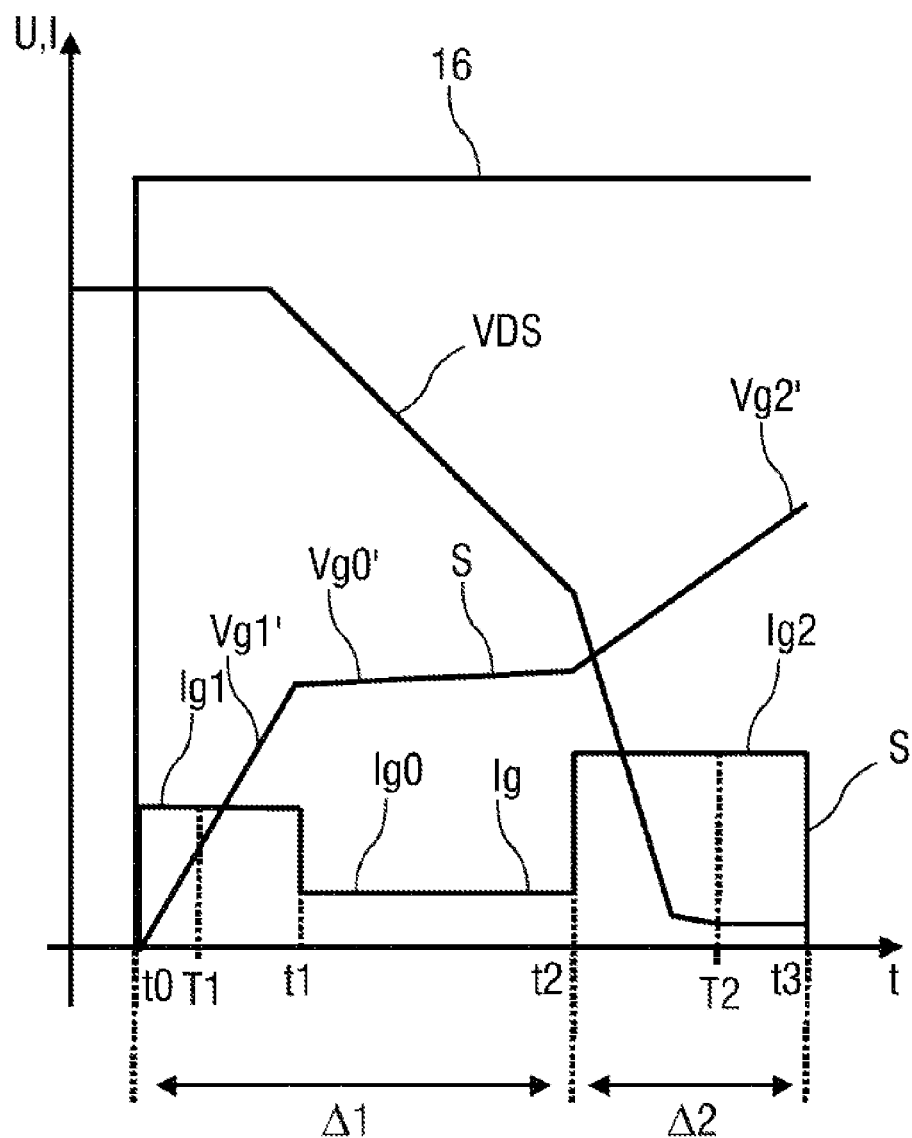
FIG. 3 shows control signals in the case of an electronic component being switched on, FIG. 4 shows a block diagram of a first exemplary embodiment of a control device for reducing electrical oscillations.

FIG. 3 correspondingly shows two variant embodiments of an electronic component 8 being switched on by means of a control device 3, which is used according to the invention instead of the switching on illustrated in FIG. 2 in order to reduce the oscillations of the output signal VDS. As in FIG. 2, the switching on of the electronic component 8 is initiated at a level-change instant t0 by the changing of a PWM signal 16 from the lower level to the upper level of the PWM signal 16.

In the case of the first variant embodiment, the control signal S controls the gate current Ig. A first control value Ig1, a second control value Ig0 and a third control value Ig2 for the gate current Ig are predefined for the switching on of the electronic component 8. After the level-change instant t0, the gate current Ig is firstly controlled from zero to the first control value Ig1. Then, the gate current Ig is kept at the first control value Ig1 until a first switchover instant t1. At the first switchover instant t1, the gate current Ig is controlled to the second control value Ig0. Then, the gate current Ig is kept at the second control value Ig0 until a second switchover instant t2. At the second switchover instant t2, the gate current Ig is controlled to the third control value Ig2. Then, the gate current Ig is kept at the third control value Ig2 until the gate voltage Vg reaches a gate voltage end value at an end value instant t3. Then, the gate current Ig falls to zero.

The control values Ig1, Ig0, Ig2 are in this case suitably predefined on the basis of the properties of the resonant circuit 1, with the result that they enable a reduction in the oscillations of the output signal VDS. In the example illustrated in FIG. 3, they are selected by way of example such that Ig0<Ig1<Ig2.

In the case of the second variant embodiment, the control signal S controls the rate of change of the gate voltage Vg'. Similarly to the first variant embodiment, a first control value Vg1', a second control value Vg0' and a third control value Vg2' for the rate of change of the gate voltage Vg' are predefined. Said three control values Vg1', Vg0', Vg2' are used in a similar manner to the control values Ig1, Ig0, Ig2 of the first variant embodiment to drive the electronic component 8, that is to say the gate voltage Vg is changed with the first control value Vg1' between the level-change instant t0 and a first switchover instant t1, with the second control value Vg0' between the first switchover instant t1 and a second switchover instant t2, and with the third control value Vg2' from the second switchover instant t2 until a gate voltage end value is reached.

In both variant embodiments, the switchover instants t1, t2 are determined by means of the control device 3 on the basis of the detected amplitude magnitudes such that the oscillation amplitudes of the output signal VDS are limited. In this case, in order to determine the first switchover instant t1, the oscillation amplitudes during a first time window Δ1, which extends from the level-change instant t0 to the second switchover instant t2, are evaluated in a manner described in more detail below to give an amplitude magnitude and, in order to determine the second switchover instant t2, the oscillation amplitudes during a second time window Δ2, which extends from the second switchover instant t2 to the end value instant t3, are evaluated in a manner described in more detail below to give an amplitude magnitude. The respective amplitude magnitudes are detected during each PWM clock period and are used to determine the switchover instants t1, t2 of the subsequent clock period in a manner described in more detail below, in order to limit the oscillation amplitudes.

Furthermore, two limit values T1, T2 are predefined for the switchover instants t1, t2 and the switchover instants t1, t2 are determined such that the first switchover instant t1 does not fall below a first limit value T1 and the second switchover instant t2 does not exceed the second limit value T2. The first limit value T1 therefore specifies a lower limit for the first switchover instant t1 and the second limit value T2 specifies an upper limit for the second switchover instant t2. The limit values T1, T2 are predefined such that the electronic component 8 is not prevented from switching on by a first switchover instant t1 which is too low or by a second switchover instant t2 which is too high.

A corresponding procedure is adopted in the case of the electronic component 8 being switched off (not illustrated). For this purpose, three control values Ig1, Ig0, Ig2 or Vg1', Vg0', Vg2', which may be different from those for switching on, are likewise defined. The electronic component 8 is controlled using the respective first control value Ig1, Vg1' between a level-change instant t0, at which the PWM signal 16 changes from the upper to the lower level, until a first switchover instant t1, using the second control value Ig0, Vg0' between the first switchover instant t1 and a second switchover instant t2 and using the third control value Ig2, Vg2' from the second switchover instant t2 until a gate voltage end value is reached. The switchover instants t1, t2 are determined, in a similar manner to the switching on, on the basis of the detected amplitude magnitudes, such that the oscillation amplitudes when switching off are limited and, in a similar manner to the switching on, said switchover instants are restricted by suitably predefined limit values T1, T2, with the result that the electronic component 8 is not prevented from switching off by a first switchover instant t1 which is too low or by a second switchover instant t2 which is too high.

Figure 4:
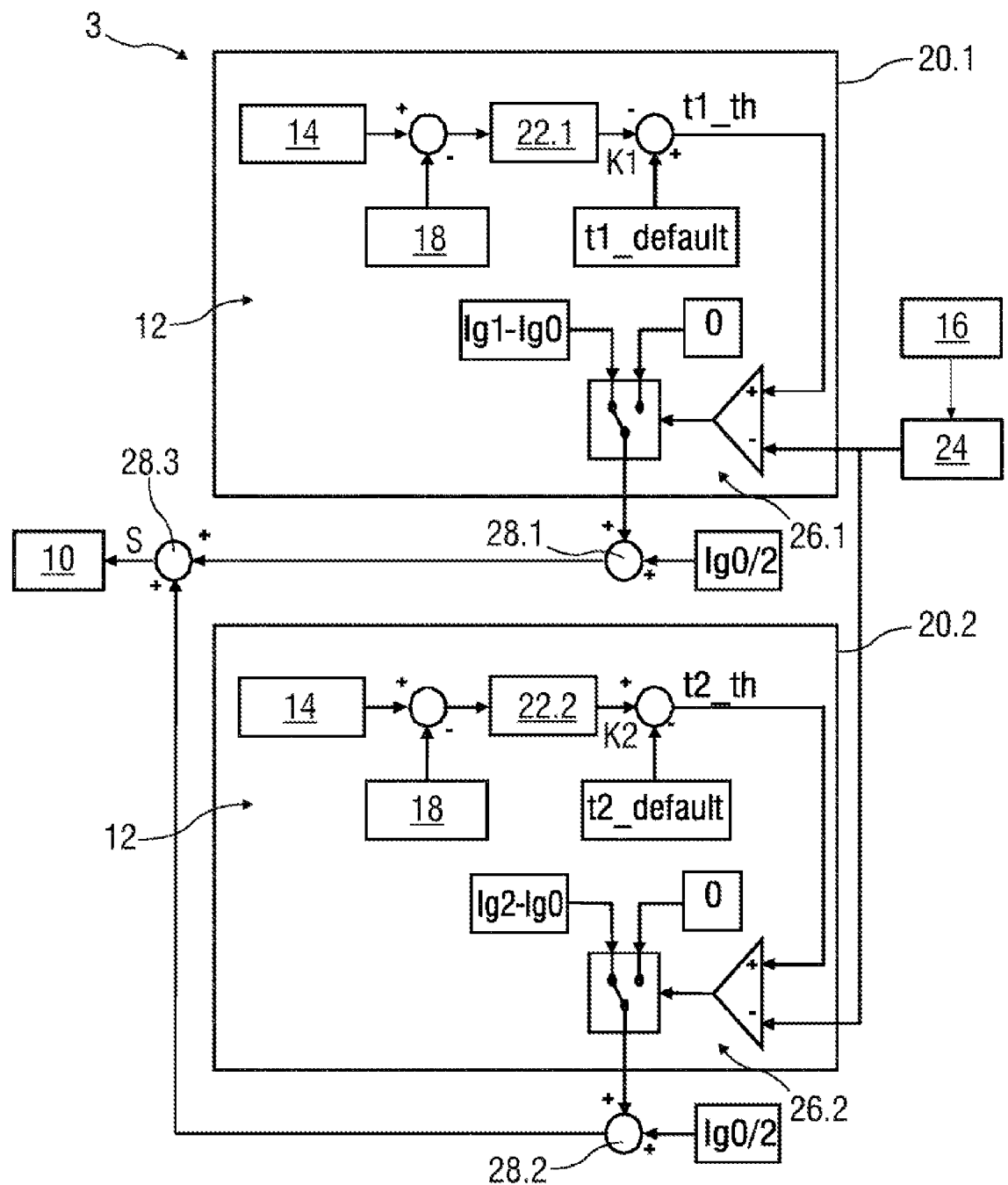

FIG. 4 shows a block diagram of an exemplary embodiment of a control device 3 for the event that the control signal S controls the gate current Ig. The control device 3 of the illustrated exemplary embodiment comprises two closed-loop control circuits 20.1, 20.2, wherein a first closed-loop control circuit 20.1 is used for the closed-loop control of the first switchover instant t1 and the second closed-loop control circuit 20.2 is used for the closed-loop control of the second switchover instant t2.

In a first embodiment, each closed-loop control circuit 20.1, 20.2 has a separate oscillation detector 14. In a second embodiment, the two closed-loop control circuits 20.1, 20.2 use the same oscillation detector 14. If each closed-loop control circuit 20.1, 20.2 has a separate oscillation detector 14, the two closed-loop control circuits 20.1, 20.2 can be used at the same time. Otherwise, they are used one after the other. By means of the first closed-loop control circuit 20.1, the oscillation amplitudes of the first time window Δ1 illustrated in FIG. 3 are evaluated; by means of the second closed-loop control circuit 20.2, the oscillation amplitudes of the second time window Δ2 are evaluated.

In the first closed-loop control circuit 20.1, the amplitude magnitude detected in the first time window Δ1 is compared with the amplitude limit 18. If said amplitude magnitude is greater than the amplitude limit 18, the first switchover instant t1 is reduced, that is to say is shifted with respect to a preceding PWM clock period in the direction of the PWM clock period start, provided it does not fall below the first limit value T1 in this case. If said amplitude magnitude is smaller than the amplitude limit 18, the first switchover instant t1 is increased, that is to say shifted with respect to a preceding PWM clock period in the direction of the PWM clock period end.

In a corresponding manner, in the second closed-loop control circuit 20.2, the amplitude magnitude detected in the second time window Δ2 is compared with the amplitude limit 18. If said amplitude magnitude is greater than the amplitude limit 18, the second switchover instant t2 is increased provided it does not exceed the second limit value T2 in this case. If said amplitude magnitude is smaller than the amplitude limit 18, the second switchover instant t2 is reduced.

The first closed-loop control circuit 20.1 has an oscillation detector 14, a first closed-loop controller 22.1 and a first output unit 26.1. The second closed-loop control circuit 20.2 likewise has an oscillation detector 14, a second closed-loop controller 22.2 and a second output unit 26.2. As already mentioned above, the two closed-loop control circuits 20.1, 20.2 can have a common oscillation detector 14 or two separate oscillation detectors 14. The two closed-loop control circuits 20.1, 20.2 are also coupled to a clock 24 which is synchronized using the PWM signal 16.

In detail, in the first closed-loop control circuit 20.1, the differences of the amplitude magnitudes detected in the first time windows Δ1 and the amplitude limits 18 are supplied to the first closed-loop controller 22.1. The first closed-loop controller 22.1 forms a first correction value K1, which is a measure for a deviation of the amplitude magnitude from the amplitude limit 18 and is restricted by a first highest value M1, from said differences for each PWM clock period. The first correction value K1 is in this case greater the greater the deviation of the amplitude magnitude from the amplitude limit 18, provided that K1<M1 is complied with. By way of example, the first correction value K1 of the first closed-loop controller 22.1 is formed as the difference of the amplitude limit 18 and the maximum amplitude value in the first measurement window or, alternatively, the integral over time of the first measurement window.

A first switchover value t1_th is formed from the first correction value K1 and a predefined first default switchover value t1_default for the first switchover instant t1, by the first correction value K1 being subtracted from the default switchover value t1_default.

Figure 5:
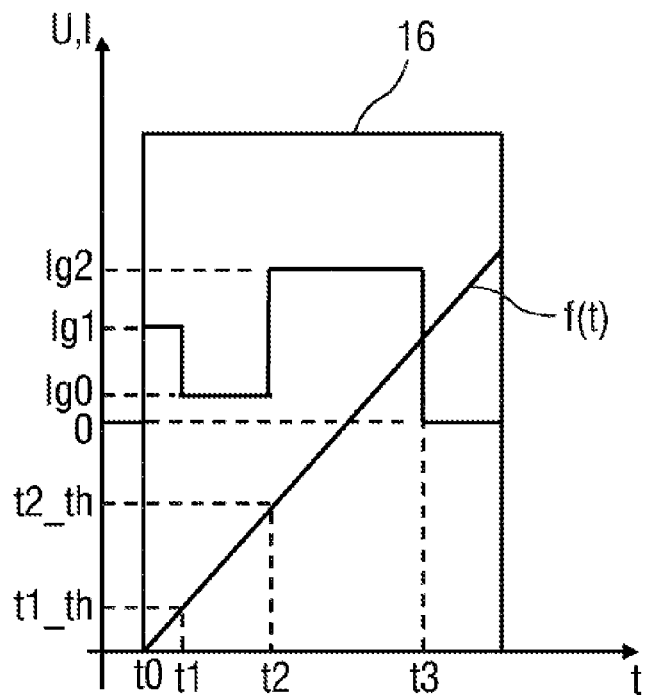
FIG. 5 shows an assignment of switchover values to switchover instants for the exemplary embodiment illustrated in FIG. 4.

According to FIG. 5, each switchover value t1_th corresponds to a first switchover instant t1, wherein switchover instances t1 and switchover values t1_th are assigned to one another by means of an assignment function f(t), which was assumed to be a linear function in FIG. 5. The first maximum value M1 corresponds in this case to the difference t1_default−T1_th, wherein T1_th corresponds to the first limit value T1. As a result, the condition K1 M1 corresponds to the condition t1≥T1.

The first switchover value t1_th is used to adjust the first switchover instant t1 of the respectively following PWM clock period. For this purpose, the first switchover value t1_th and an output signal of the clock 24 are supplied to the first output unit 26.1.

The first switchover value t1_th is translated into the first switchover instant t1 by means of the assignment function f(t). Provided that t<t1, the first output unit 26.1 outputs the difference Ig1−Ig0 of the first control value Ig1 and the second control value Ig0 to a first adder 28.1 during the following PWM clock period. If t>t1, the first output unit 26.1 outputs the value zero to the first adder 28.1. The first adder 28.1 adds half of the second control value Ig0 to the output of the first output unit 26.1.

In a corresponding manner, in the second closed-loop control circuit 20.2, the differences of the amplitude magnitudes detected in the second time windows Δ2 and the amplitude limits 18 are supplied to a second closed-loop controller 22.2, which forms a second correction value K2 from said differences. A second switchover value t2_th is formed for the second switchover instant t2 from the second correction value K2 and a predefined second default switchover value t2_default, by the second default switchover value t2_default being subtracted from the second correction value K2.

In order to adjust the second switchover instant t2 of the following PWM clock period, the second switchover value t2_th together with the output signal of the clock 24 are supplied to a second output unit 26.2 and are translated into the second switchover instant t2 by means of the assignment function f(t). Provided that t<t2, the second output unit 26.2 outputs the value zero to a second adder 28.2 during the following PWM clock period. If t>t2, the second output unit 26.2 outputs the value Ig2−Ig0 to the second adder 28.2. The second adder 28.2 adds half of the second control value Ig0 to the output of the second output unit 26.2.

The outputs of the first adder 28.1 and the second adder 28.2 are supplied to a third adder 28.3 and are added by said third adder to the control signal S which is supplied to the signal generator 10. The control signal S results in the first control value Ig1 for t<t1, in the second control value Ig0 for t1<t<t2, and in the third control value Ig2 for t>t2. The signal generator 10 correspondingly adjusts the gate current Ig for t0<t<t3 to said control values Ig1, Ig0, Ig2.

Figure 6:
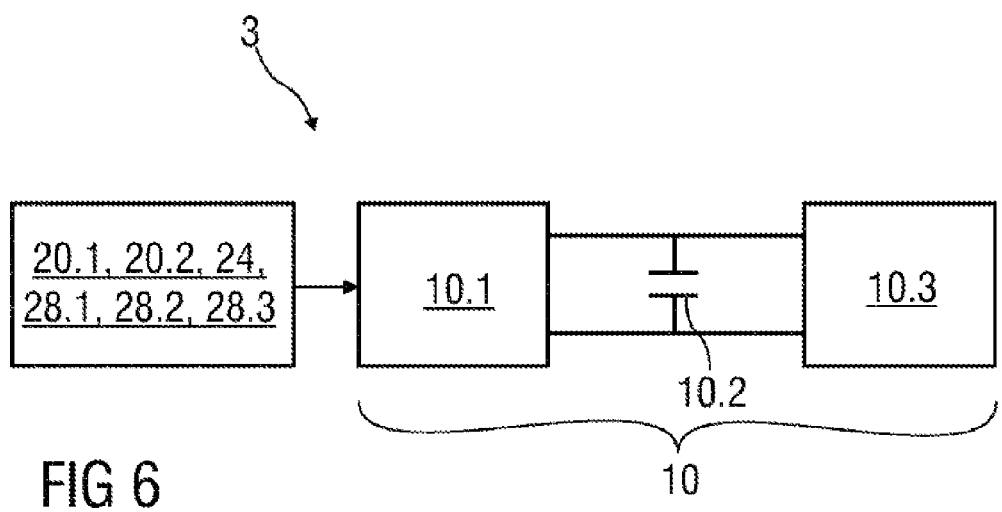
FIG. 6 shows a block diagram of a second exemplary embodiment of a control device for reducing electrical oscillations.

FIG. 6 schematically shows an exemplary embodiment of a control device 3 for the event that the control signal S controls the rate of change of the gate voltage Vg'. The control device 3 of this exemplary embodiment comprises two closed-loop control circuits 20.1, 20.2, a clock 24 and three adders 28.1, 28.2, 28.3, which are designed and used as in the above exemplary embodiment described with reference to FIG. 4. In contrast to the exemplary embodiment described with reference to FIG. 4, the signal generator 10 comprises a voltage-controlled current source 10.1, a capacitor 10.2 and a voltage-controlled voltage source 10.3.

The current source 10.1 is designed in a similar manner to the signal generator 10 of the exemplary embodiment described with reference to FIG. 4. The output of the third adder 28.3 is supplied to said current source. The capacitor 10.2 is connected between the current source 10.1 and the voltage source 10.3 in order to convert the time-dependent current signals which are output by the current source 10.1 into voltage signals of different rates of change of the gate voltage Vg', which in this case form the control signal S with control values Vg1', Vg0', Vg2'. The voltage source 10.3 changes the gate voltage Vg in accordance with said control values Vg1', Vg0', Vg2'.

Figure 7:
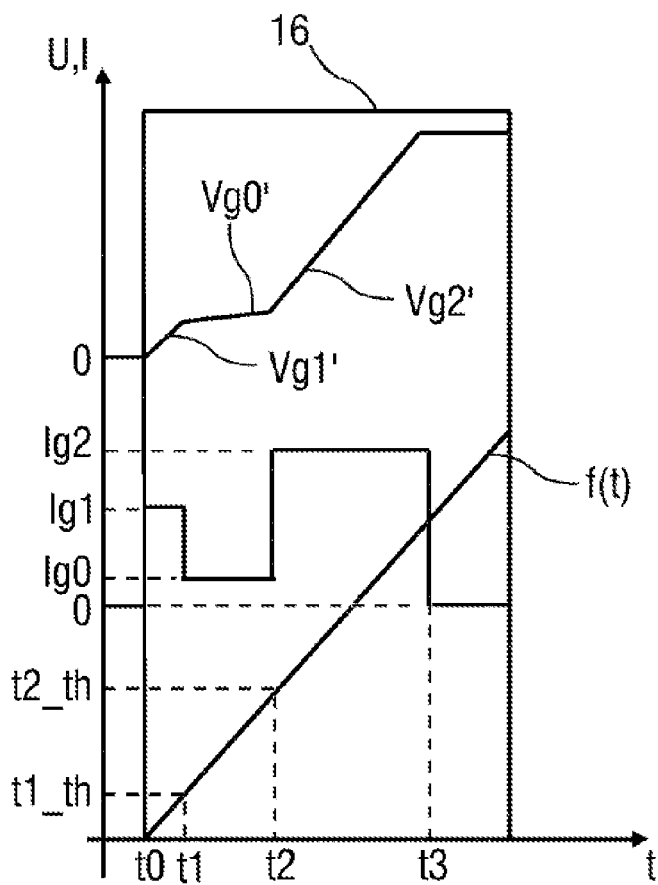
FIG. 7 shows an assignment of switchover values to switchover instants for the exemplary embodiment illustrated in FIG. 6.

FIG. 7 shows, in a similar manner to FIG. 5, the assignment of the switchover values t1_th, t2_th to the switchover instants t1, t2 and the corresponding control values Vg1', Vg0', Vg2' of the rate of change of the gate voltage Vg'.

Figure 8:
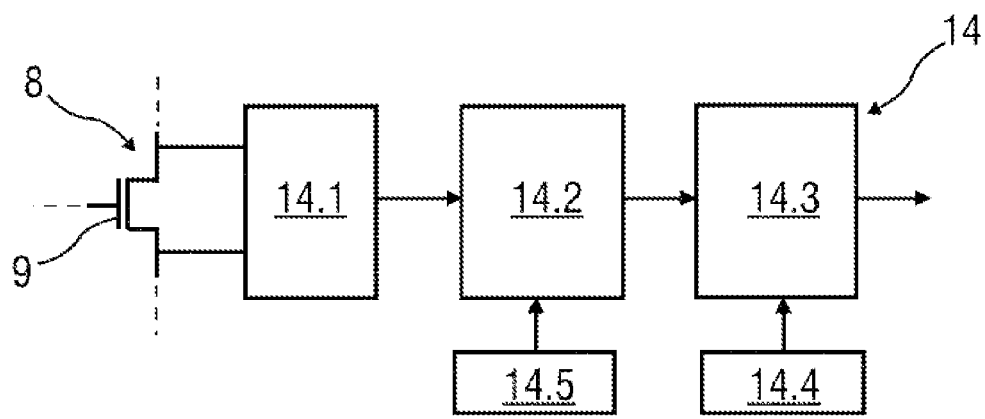
FIG. 8 shows a block diagram of an exemplary embodiment of an oscillation detector.

FIG. 8 shows a block diagram of a possible exemplary embodiment of an oscillation detector 14, which is connected to an electronic component 8 designed as a MOSFET, in order to detect oscillations of the output signal VDS (that is to say the drain-source voltage) of the MOSFET. The oscillation detector 14 comprises a filter 14.1, an amplitude detector 14.2 and an evaluation member 14.3, which is designed as a sample-and-hold member and is coupled to a trigger 14.4.

Figure 9:
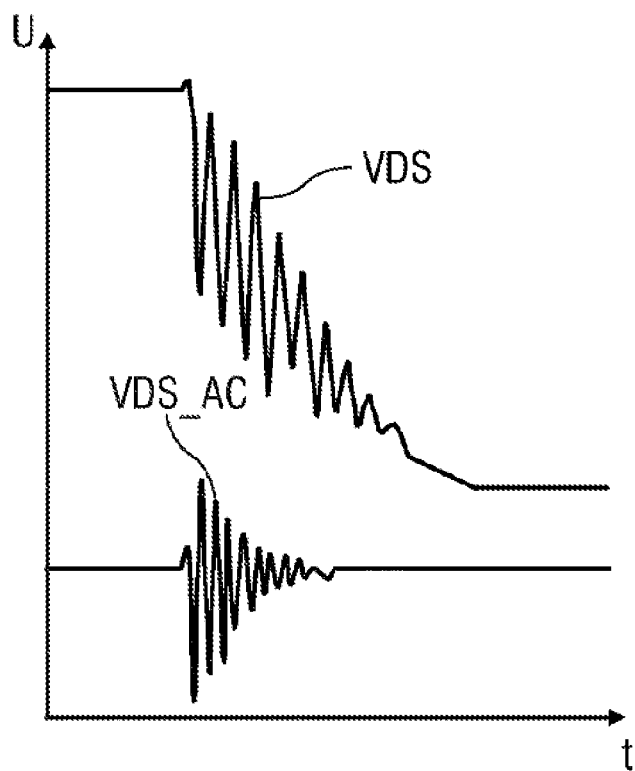
FIG. 9 shows the effect of a filter of an oscillation detector.

FIG. 9 shows the effect of the filter 14.1 when the MOSFET is switched on. The filter 14.1 extracts an oscillation signal VDS_AC from the output signal VDS, which oscillation signal is an alternating-current component of the output signal VDS. The filter 14.1 may be designed as a band-pass filter or a high-pass filter.

The amplitude detector 14.2 is used to detect oscillation amplitudes of the oscillation signal VDS_AC. In this case, the amounts of all the oscillation amplitudes or only the oscillation semi-amplitudes of the oscillation signal VDS_AC may be detected. The amplitude detector 14.2 may be reset using a reset 14.5.

Figure 10:
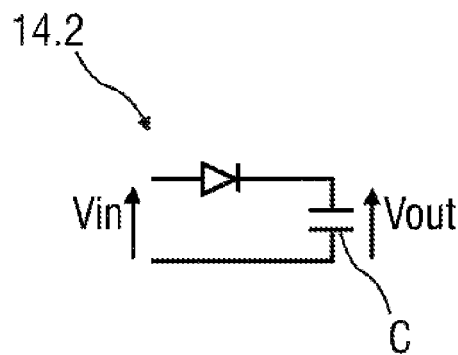
FIG. 10 shows a first embodiment of an amplitude detector.
Figure 11:
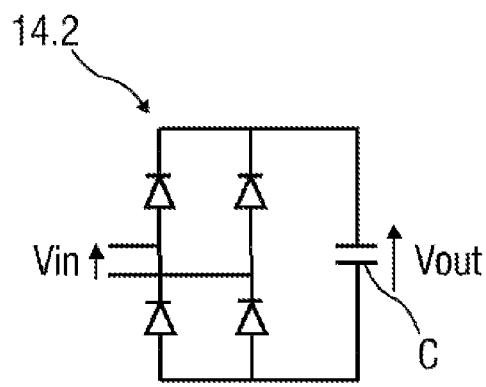
FIG. 11 shows a second embodiment of an amplitude detector.
Figure 12:
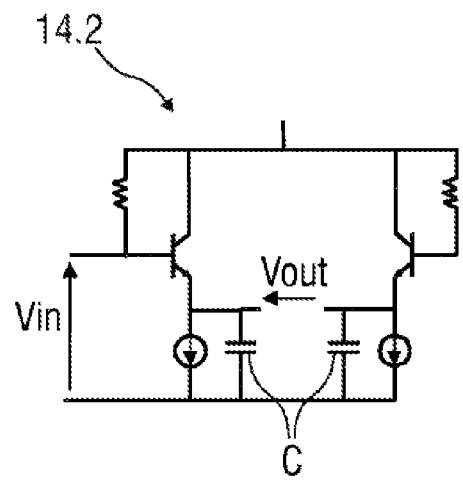
FIG. 12 shows a third embodiment of an amplitude detector.

FIGS. 10 to 12 show various possible designs of an amplitude detector 14.2 with in each case an input voltage Vin and an output voltage Vout and at least one detector capacitor C. FIG. 10 shows a passive half-cycle diode circuit for detecting the positive half-cycle of oscillation amplitudes of the oscillation signal VDS_AC. FIG. 11 shows a passive diode circuit for detecting the positive and negative half-cycles of the oscillation amplitudes of the oscillation signal VDS_AC. FIG. 12 shows an active circuit for detecting the positive half-cycles of the oscillation amplitudes of the oscillation signal VDS_AC. The active amplitude detector can detect markedly smaller (smaller by approximately a factor of 10) amplitudes than the passive detectors. When the amplitude detector 14.2 is reset by means of the reset 14.5, the at least one detector capacitor C is discharged.

The evaluation member 14.3 is designed as a sample-and-hold member which samples and temporarily stores the output signals of the amplitude detector 14.2 and calculates a maximum amplitude via the amounts of the detected oscillation amplitudes within the respective time window Δ1, Δ2 (see FIG. 3). In order to sample the output signals of the amplitude detector 14.2 in a manner corresponding to the oscillation amplitudes and in order to adjust the time window Δ1, Δ2, the evaluation member 14.3 is triggered by means of a trigger 14.4. The calculated maximum amplitude is in this case the amplitude magnitude detected by the oscillation detector 14.

Alternatively, the evaluation member 14.3 can be designed as an integrator, which integrates signal amounts, detected by the amplitude detector 14.2, over the respective time window Δ1, Δ2 to give an integral value, wherein the time window Δ1, Δ2 is adjusted by the trigger 14.4. In this case, the integral value is the amplitude magnitude detected by the oscillation detector 14.

The oscillation detector 14 can also be designed without a filter 14.1 if the maximum of the output signal VDS is greater than a maximum DC-voltage component of the output signal VDS or if a minimum of the output signal VDS is smaller than a minimum DC-voltage component of the output signal VDS.

Figure 13:
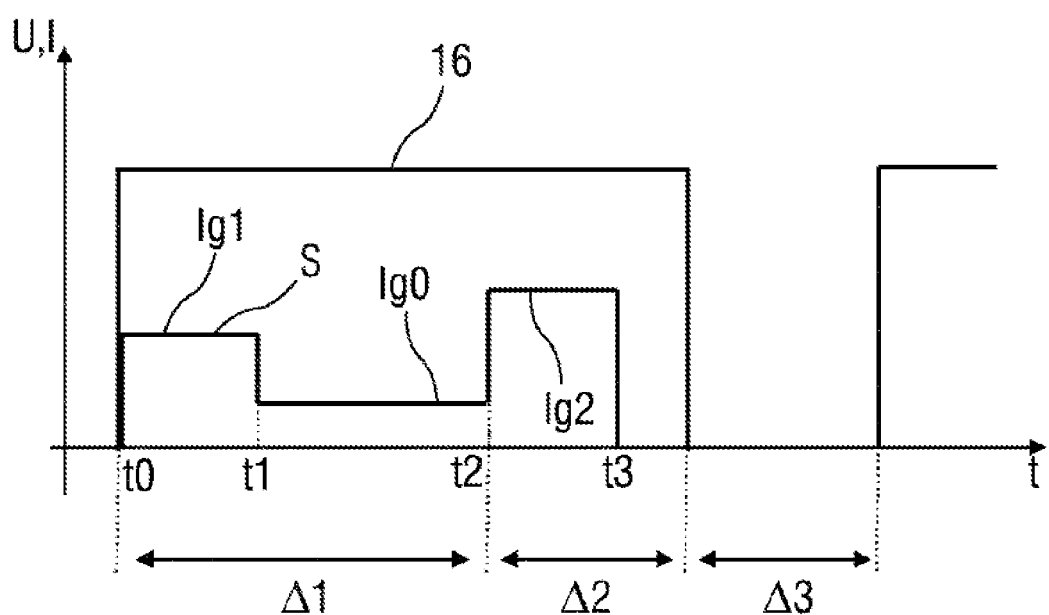
FIG. 13 shows time windows for the use of an oscillation detector and assignment of a closed-loop control circuit.
Figure 14:
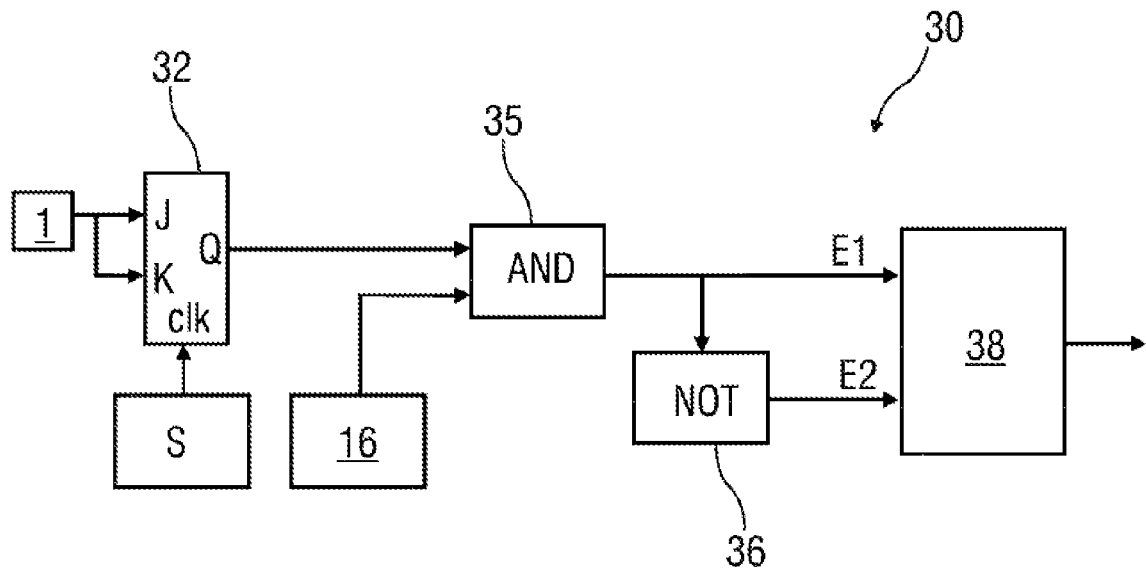
FIG. 14 shows an open-loop control circuit for the use of an oscillation detector and assignment of a closed-loop control circuit.
Figure 15:
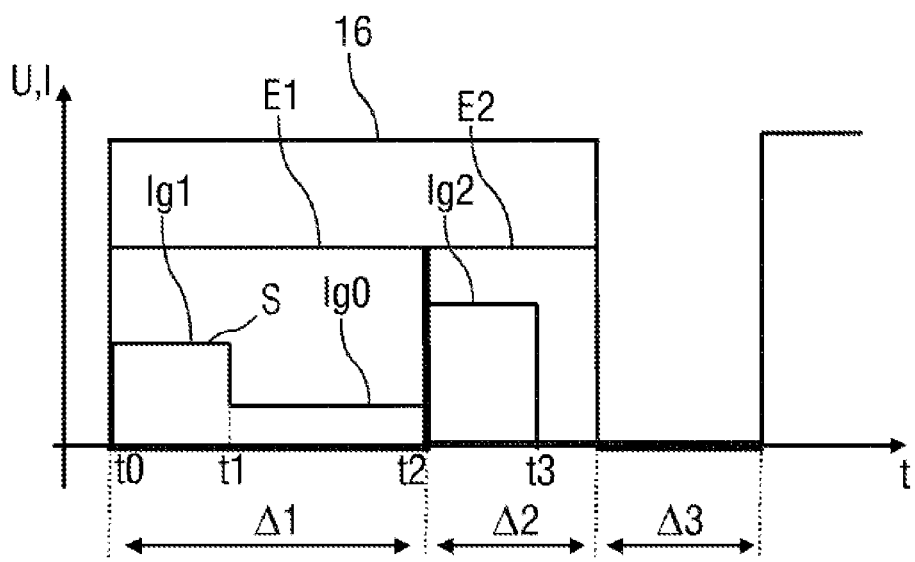
FIG. 15 shows signals for the use of an oscillation detector and assignment of a closed-loop control circuit.

FIGS. 13 to 15 relate to a control device 3 having two closed-loop control circuits 20.1, 20.2 as in FIG. 4 and only one oscillation detector 14, with the result that the two closed-loop control circuits 20.1, 20.2 use the same oscillation detector 14.

FIG. 13 shows three time windows Δ1, Δ2, Δ3 for this case. The first time window Δ1 extends, as in FIG. 3, from the level-change instant to, at which the PWM signal 16 changes from the lower to the upper level, to the second switchover instant t2, a second time window Δ2 extends from the second switchover instant t2 to an instant at which the PWM signal 16 changes again from the upper to the lower level, and the third time window Δ3 is the following time interval during which the PWM signal 16 assumes the lower level thereof.

During the first time window Δ1, the first switchover instant t1 for the following PWM clock period is determined and the second switchover instant t2 is not changed. During the second time window Δ2, the second switchover instant t2 for the following PWM clock period is determined and the first switchover instant t1 is not changed. The closed-loop control circuit 20.1, 20.2 used for this in each case may be selected either with a control circuit 30 (see FIG. 14) or by means of an external signal.

In the event that a sample-and-hold member is used as evaluation member 14.3 and a maximum amplitude is used as amplitude magnitude, the maximum amplitude for the determination of the first switchover instant t1 of the following PWM clock period is calculated at the end of the first time window Δ1 and the amplitude maximum for the determination of the second switchover instant t2 for the following PWM clock period is calculated at the end of the second time window Δ2. The amplitude detector 14.2 is in this case reset by means of the reset 14.5 at the second switchover instant t2. During the third time window Δ3, the amplitude detector 14.2 is kept switched off or in the reset state by means of the reset 14.5.

In the event that an integrator is used as evaluation member 14.3 and an integral value is used as amplitude magnitude, the integral value for the determination of the first switchover instant t1 of the following PWM clock period is calculated during the first time window Δ1 and the integral value for the determination of the second switchover instant t2 of the following PWM clock period is calculated during the second time window Δ2. During the third time window Δ3, the amplitude detector 14.2 and the integrator are kept switched off or in the reset state and no integral value is calculated.

FIG. 14 shows a control circuit 30 for generating signals for the amplitude detector 14.2, the evaluation member 14.3 and the selection of the closed-loop control circuit 20.1, 20.2. The control circuit 30 comprises a JK flip-flop 32, a logic AND gate 34, a logic NOT gate 36 and a selection member 38.

The present control signal S is supplied to the JK flip-flop 32. The JK flip-flop 32 changes its output signal with each change in the control signal S. The output signal of the JK flip-flop 32 and the PWM signal 16 are supplied to the AND gate 34. The output value E1 of the AND gate 34 is supplied to the selection member 38 and to the NOT gate 36. The possible output values E1, E2 are each referred to as one and zero in the following text.

During the third time window Δ3, all of the components which are not required, such as the AND gate 34 and the NOT gate 36, are switched off and E1 and E2 are set to zero. In order to switch these components on again, the output of the first control value Ig1 or Vg1' can be delayed with respect to the level-change instant t0 by a time interval which is sufficient to switch on said components.

FIG. 15 schematically shows the resulting output values E1, E2 during the time windows Δ1, Δ2, Δ3. E1 assumes the value one in the first time window Δ1 and the value zero in the other two time windows Δ2, Δ3. E2 assumes the value one in the second time window Δ2 and the value zero in the other two time windows Δ1, Δ3.

The respectively used closed-loop control circuit 20.1, 20.2 is selected by means of the selection member 38. The first closed-loop control circuit 20.1 is selected if the output value E1 of the AND gate 34 is one. The second closed-loop control circuit 20.2 is selected if the output value E2 of the NOT gate 36 is one.

The AND gate 34 and the NOT gate 36 are also used to drive the oscillation detector 14. In the event that a sample-and-hold member is used as evaluation member 14.3 and a maximum amplitude is used as amplitude magnitude, a maximum amplitude is in each case calculated when the output value E1 of the AND gate 34 changes from one to zero, and when the output value E2 of the NOT gate 36 changes from one to zero.

In the event that an integrator is used as evaluation member 14.3 and an integral value is used as amplitude magnitude, a first integral value (for the determination of the first switchover instant t1) is calculated while the output value E1 of the AND gate 34 assumes the value one, and a second integral value (for the determination of the second switchover instant t2) is calculated while the output value E2 of the NOT gate 36 assumes the value one.

Figure 16:
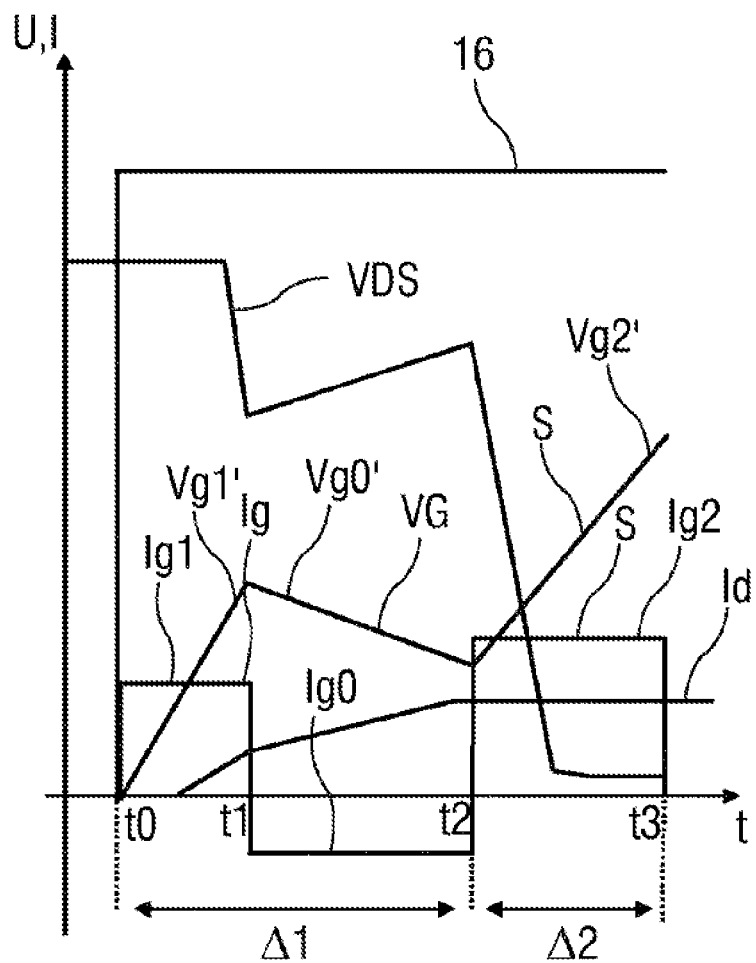
FIG. 16 shows control signals with a negative control value in the case of an electronic component being switched on, FIG. 17 shows a block diagram of a third exemplary embodiment of a control device for reducing electrical oscillations.

In a similar manner to FIG. 3, FIG. 16 shows two variant embodiments of an electronic component 8 being switched on by means of a control device 3, wherein, in contrast to FIG. 3, the second control value Ig0 or Vg0' in each case assumes a negative value. This enables a higher value for Ig1 or Vg1' and at the same time minimization of the oscillation amplitudes of the oscillation signal VDS_AC as before. This advantageously shortens the switching time for switching on the electronic component 8 and hence the switching power losses thereof. FIG. 16 also shows the temporal profile of a drain current Id at the drain of the electronic component 8.

Figure 17:
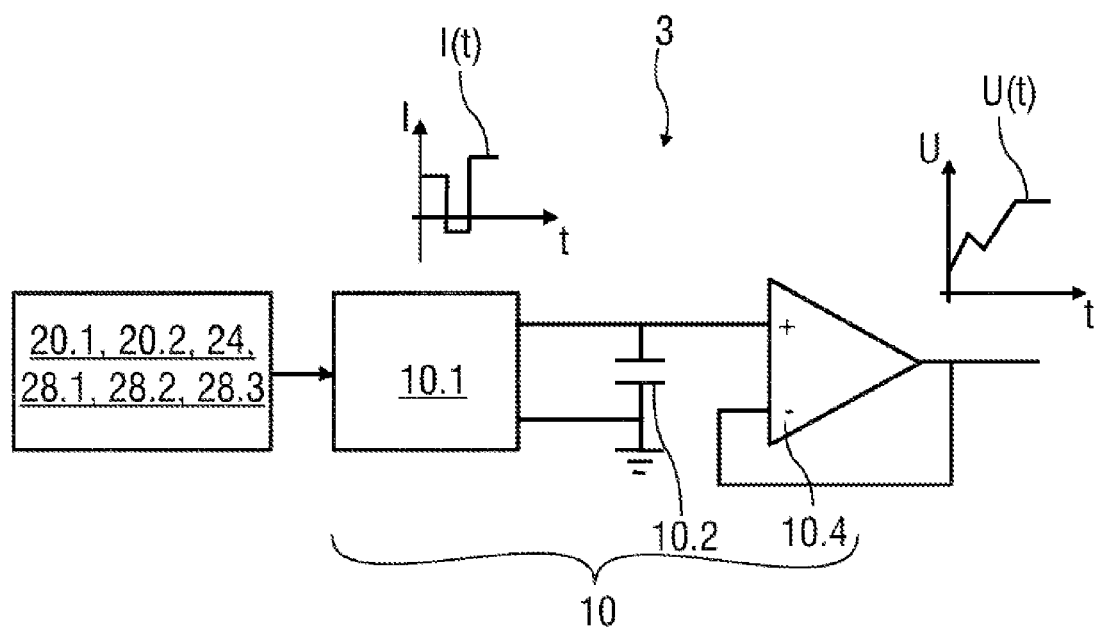

In a similar manner to FIG. 6, FIG. 17 schematically shows an exemplary embodiment of a control device 3 for realizing the second variant embodiments shown in FIG. 16, in which variant embodiment the control signal S controls the rate of change of the gate voltage Vg'. The signal generator 10 of the control device 3 comprises, in addition to a current source 10.1 and a capacitor 10.2, an impedance converter 10.4. In contrast to the exemplary embodiment shown in FIG. 6, a connection of the capacitor 10.2 is grounded, while the other connection of the capacitor 10.2 is connected to an output of the current source 10.1 and to the input of the impedance converter 10.4. FIG. 17 also schematically illustrates a current output signal I(t) output by the current source and a voltage output signal U(t) output by the impedance converter 10.4. The voltage output signal U(t) of the impedance converter 10.4 is supplied to the gate 9 of the electronic component 8.

An alternative control device 3 to that in FIG. 17, by means of which alternative control device the second variant embodiment shown in FIG. 16 can likewise be realized, likewise has a current source 10.1 and a capacitor 10.2 but no impedance converter 10.4. In this case, in contrast to FIG. 17, the capacitor 10.2 is connected between gate 9 and source of the electronic component (MOSFET) 8 and is configured to be large enough to influence the rate of change of the gate voltage Vg'. A capacitor 10.2 such as this cannot be so easily realized in an integrated circuit and is therefore preferably embodied as a discrete external capacitor 10.2.

Figure 18:
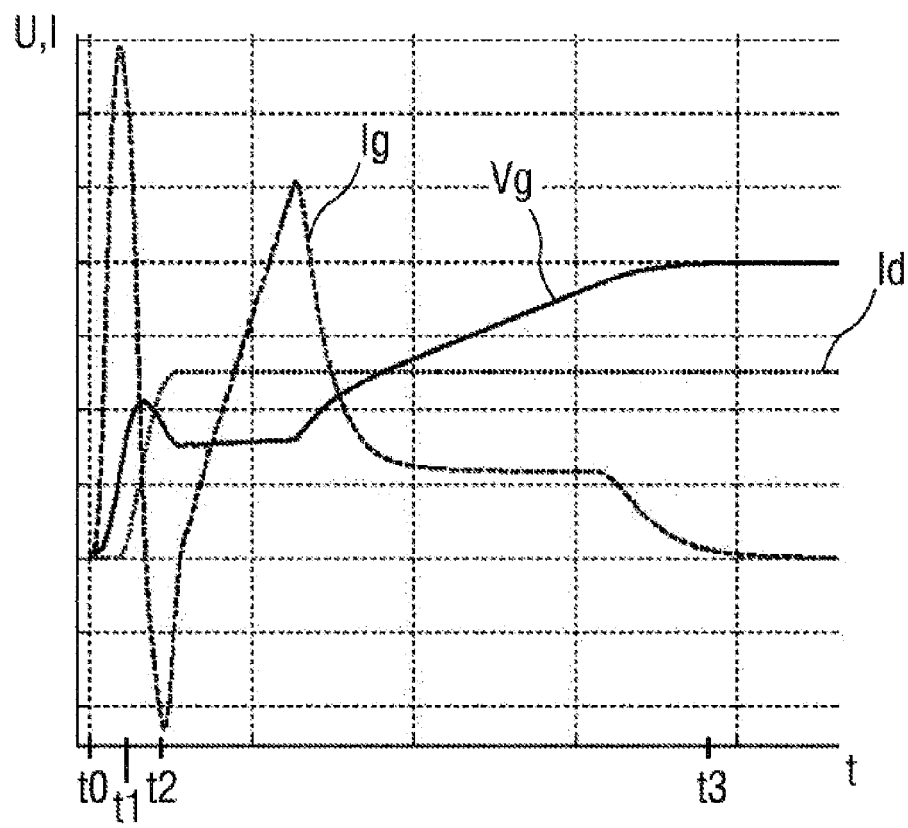
FIG. 18 shows a simulation of realistic temporal profiles of currents and voltages in the case of an electronic component being switched on according to the concept shown in FIGS. 16 and 17.

FIG. 18 shows a simulation of realistic temporal profiles of the gate current Ig, the gate voltage Vg and the drain current Id, which temporal profiles are to be expected in the case of the switching-on controller illustrated in FIG. 17.

In order to avoid oscillations caused by diode capacitances, a rate of change of the gate current Ig' (temporal derivation of the gate current Ig) should be limited at the second switchover instant t2, that is to say at the changeover from the second control value Ig0, Vg0' to the third control value Ig2, Vg2'. If the control signal S controls the rate of change of the gate voltage Vg', such limiting is less restrictive than in the event of the control signal S controlling the gate current Ig because the limiting of the rate of change of the gate voltage Vg' automatically also limits the rate of change of the gate current Ig' and the rate of change of the gate current Ig' is also limited in this case by the hardware of the signal generator 10.

However, depending on the specific application, the hardware which makes up the signal generator 10 can also sufficiently limit the rate of change of the gate current Ig' if the control signal S controls the gate current Ig and a current source is used as signal generator 10.

Instead of adjusting the third control value Ig2 or Vg2' using the control device 3, the gate 9 and a voltage source can alternatively also be connected to one another by a switch. In this case, the gate current Ig or the rate of change of the gate voltage Vg' is not actively controlled after the second switchover instant t2, but determined by parameters of the circuit 1.

The above-described exemplary embodiments of the invention may be modified and extended in various ways. In particular, more than three control values Ig1, Ig0, Ig2 or Vg1', Vg0', Vg2' may be predefined for each PWM clock period. In that case, more than two switchover instants t1, t2 are correspondingly provided, which are determined in each case on the basis of an amplitude magnitude calculated during a preceding PWM clock period.

LIST OF REFERENCE SYMBOLS

1 circuit
2 outer branch
2.1, 2.2 partial branch
3 control device
4 bridge branch
6 electrical load
8 electronic component
9 control connection (gate)
10 signal generator
10.1 current source
10.2 capacitor
10.3 voltage source
10.4 impedance converter
12 control unit
14 oscillation detector
14.1 filter
14.2 amplitude detector
14.3 evaluation member
14.4 trigger
14.5 reset
16 PWM signal
18 amplitude limit
20.1, 20.2 closed-loop control circuit
22.1, 22.2 closed-loop controller
24 clock
26.1, 26.2 output unit
28.1, 28.2, 28.3 adder
30 control circuit
32 JK flip-flop
34 AND gate
36 NOT gate
38 selection member
C detector capacitor
$\Delta 1$, $\Delta 2$, $\Delta 3$ time window
E1 output value of the AND gate
E2 output value of the NOT gate
f(t) assignment function
I current
Id drain current
Ig gate current
Ig1, Ig0, Ig2 control value of the gate current
I(t) current output signal
K1, K2 correction value
S control signal
t time
t0 level-change instant
t1, t2 switchover instant
t3 end value instant
T1, T2 limit value
t1_default, t2_default default switchover value
t1_th, t2_th switchover value
U voltage
U(t) voltage output signal
VDS output signal
VDS_AC oscillation signal
Vg gate voltage
Vg' rate of change of the gate voltage
Vg1', Vg0', Vg2' control value of rate of change of gate voltage
Vin input voltage
Vout output voltage

The invention claimed is:

1. A method of switching an electronic component on or off under the control of a pulse-width-modulation signal, the electronic component being configured to output an output signal controlled by way of a control signal, the method comprising:
   initiating the switching on or off within a pulse-width-modulation clock period at a level-change instant by a change in the pulse-width-modulation signal at which the pulse-width-modulation signal changes from a lower level to an upper level;
   calculating at least one amplitude magnitude of an oscillation of the output signal during each clock period of the pulse-width-modulation signal;
   predefining at least one first control value and one second control value of the control signal;
   in order to perform the switching on when the switching on has been initiated or in order to perform the switching off when the switching off has been initiated, adjusting the control signal to the first control value within each pulse-width-modulation clock period between the level-change instant and a first switchover instant and adjusting the control signal to the second control value between the first switchover instant and a second switchover instant and adjusting the control signal to a third control value from the second switchover instant until a gate voltage end value of a gate voltage is reached at a control connection of the electronic component, wherein the gate voltage end value is selected to turn on the electronic component when the switching on has been initiated or the gate voltage end value is selected to turn off the electronic component when the switching off has been initiated; and
   determining each of the first and second switchover instants of a pulse-width-modulation clock period on a basis of an amplitude magnitude associated with the pulse-width-modulation clock period and calculated during a preceding pulse-width-modulation clock period, to thereby limit oscillation amplitudes of an oscillation of the output signal.

2. The method according to claim 1, which comprises calculating as the amplitude magnitude a maximum amplitude value of oscillation amplitudes, which are detected within a time window, of the oscillation of the output signal.

3. The method according to claim 1, which comprises calculating as the amplitude magnitude an integral value of absolute values, which are detected within a time window, of oscillation signals of the oscillation of the output signal.

4. The method according to claim 1, which comprises determining the first switchover instant of a pulse-width-modulation clock period on a basis of an amplitude magnitude of the oscillation of the output signal in a first time window, wherein the first time window extends from the level-change instant to the second switchover instant of a preceding pulse-width-modulation clock period.

5. The method according to claim 1, which comprises determining the second switchover instant of a pulse-width-modulation clock period on a basis of an amplitude magnitude of the oscillation of the output signal in a second time window, wherein the second time window extends from the second switchover instant of a preceding pulse-width-modulation clock period to a subsequent level change of the pulse-width-modulation signal.

6. The method according to claim 1, wherein the second switchover instant of a pulse-width-modulation clock period is determined on the basis of an amplitude magnitude of the oscillation of the output signal in a second time window, wherein the second time window extends from the second switchover instant of the preceding pulse-width-modulation clock period until the gate-voltage end value of the gate voltage at the control connection of the electronic component is reached.

7. The method according to claim 1, which comprises predefining an amplitude limit and a first limit value, and
   shifting the first switchover instant of a pulse-width-modulation clock period with respect to a preceding pulse-width-modulation clock period in a direction of a pulse-width-modulation clock period end if the amplitude magnitude associated with the first switchover instant is smaller than the amplitude limit; and
   shifting the first switchover instant in a direction of the pulse-width-modulation clock period start if the amplitude magnitude associated with the first switchover instant is greater than the amplitude limit, and the first limit value is not undershot by shifting the first switchover instant.

8. The method according to claim 1, which comprises predefining an amplitude limit and a second limit value, and
   shifting the second switchover instant of a pulse-width-modulation clock period with respect to a preceding pulse-width-modulation clock period in a direction of a pulse-width-modulation clock period start if the amplitude magnitude associated with the second switchover instant is smaller than the amplitude limit; and
   shifting the second switchover instant in a direction of the pulse-width-modulation clock period end if the amplitude magnitude associated with the second switchover instant is greater than the amplitude limit, and the second limit value is not exceeded by shifting the second switchover instant.

9. The method according to claim 1, which comprises using the control signal to control a gate current or a rate of change of the gate voltage of a control connection of the electronic component.

10. A control device for performing the method according to claim 1, the control device comprising:
    at least one oscillation detector configured for calculating an amplitude magnitude associated with a pulse-width-modulation clock period;
    a control unit configured for determining the switchover instants at which the pulse-width-modulation signal changes from a lower level to an upper level and generating the control signal, said control unit configured for determining the switchover instants on a basis of the amplitude magnitude associated with the pulse-width-modulation clock period and calculated during a preceding pulse-width-modulation clock period, to thereby limit oscillation amplitudes of an oscillation of the output signal; and
    a signal generator configured for controlling the electronic component in accordance with the control signal.

11. The control device according to claim 10, which further comprises:
    a first closed-loop control circuit configured for controlling the first switchover instant and the control signal on a basis of an amplitude magnitude;
    said first closed-loop control circuit including said at least one oscillation detector for calculating the amplitude magnitude, a first closed-loop controller for forming a first correction value, which is a measure for a deviation of the amplitude magnitude from an amplitude limit, and a first output unit configured to determine the first switchover instant of each pulse-width-modulation clock period on the basis of the first correction value

17 and having an output changing at the first switchover instant to generate the control signal.

12. The control device according to claim 10, which further comprises:
a second closed-loop control circuit configured for controlling the second switchover instant and the control signal on a basis of an amplitude magnitude;
said second closed-loop control circuit including said at least one oscillation detector for calculating the amplitude magnitude, a second closed-loop controller for forming a second correction value, which is a measure for a deviation of the amplitude magnitude from an amplitude limit, and a second output unit configured to determine the second switchover instant of each pulse-width-modulation clock period on the basis of the second correction value and having an output changing at the second switchover instant to generate the control signal.

13. The control device according to claim 10, wherein said at least one oscillation detector is one of a plurality of oscillation detectors each comprising an amplitude detector and an evaluation member, wherein said amplitude detector is configured to detect oscillation amplitudes of an oscillation of the output signal and said evaluation member is configured as a sample-and-hold member for calculating a maximum amplitude or as an integrator for integration of the oscillation amplitudes detected by said amplitude detector.

14. The control device according to claim 13, which comprises a filter connected upstream of said amplitude detector and configured for extracting an oscillation signal from the output signal.

15. The control device according to claim 10, configured for reducing electrical oscillations in a resonant electric circuit with an electronic component designed to output an output signal which can be controlled by way of a control signal.

16. The method according to claim 1, implemented for reducing electrical oscillations in a resonant electric circuit with an electronic component designed to output an output signal which can be controlled by way of a control signal.

17. A method for repeatedly switching an electronic component on and off, wherein the electronic component is configured to output an output signal under control of a control signal, the method comprises:
switching the electronic component on or off in each case once in successive time intervals;
calculating at least one amplitude magnitude of an oscillation of the output signal during each time interval;
predefining at least one first control value and one second control value of the control signal;
in order switch the electronic component on or to switch the electronic component off, adjusting the control signal to the first control value within each time interval between a switching instant at which the pulse-width-modulation signal changes from a lower level to an upper level and a first switchover instant and adjusting the control signal to the second control value between the first switchover instant and a second switchover instant and adjusting the control signal to a third control value from the second switchover instant until a gate voltage end value of a gate voltage is reached at a control connection of the electronic component, wherein the gate voltage end value is selected to turn on the electronic component when switching on the electronic component or the gate voltage end value is selected to turn off the electronic component when switching off the electronic component; and

18 determining each switchover instant of a given time interval on a basis of an amplitude magnitude that is associated with the given time interval and is calculated during a preceding time interval, to limit oscillation amplitudes of an oscillation of the output signal.

18. A control device for switching an electronic component on or off under the control of a pulse-width-modulation signal, the electronic component being configured to output an output signal controlled by way of a control signal, the control device comprising:
at least one oscillation detector for calculating an amplitude magnitude;
a control unit for determining switchover instants and generating the control signal;
a signal generator for controlling the electronic component in accordance with the control signal;
a first closed-loop control circuit for controlling a first switchover instant and the control signal on a basis of an amplitude magnitude;
a second closed-loop control circuit for controlling a second switchover instant and the control signal on a basis of an amplitude magnitude;
said first closed-loop control circuit including said at least one oscillation detector for calculating the amplitude magnitude, a first closed-loop controller for forming a first correction value, which is a measure for a deviation of the amplitude magnitude from an amplitude limit, and a first output unit configured to determine said first switchover instant of each pulse-width-modulation clock period on the basis of the first correction value and having an output changing at said first switchover instant to generate the control signal;
said second closed-loop control circuit including said at least one oscillation detector for calculating the amplitude magnitude, a second closed-loop controller for forming a second correction value, which is a measure for a deviation of the amplitude magnitude from an amplitude limit, and a second output unit configured to determine said second switchover instant of each pulse-width-modulation clock period on the basis of the second correction value and having an output changing at said second switchover instant to generate the control signal; and
the control device being configured for:
initiating the switching on or off within a pulse-width-modulation clock period at a level-change instant by a change in the pulse-width-modulation signal;
calculating at least one amplitude magnitude of an oscillation of the output signal during each clock period of the pulse-width-modulation signal;
predefining at least one first control value and one second control value of the control signal;
in order to perform the switching on when the switching on has been initiated or in order to perform the switching off when the switching off has been initiated, adjusting the control signal to the first control value within each pulse-width-modulation clock period between the level-change instant and said first switchover instant and adjusting the control signal to the second control value between said first switchover instant and said second switchover instant and adjusting the control signal to a third control value from said second switchover instant until a gate voltage end value of a gate voltage is reached at a control connection of the electronic component, wherein the gate voltage end value is selected to turn on the electronic component when the switching on has been initiated or the gate voltage end value is selected to turn off the electronic component when the switching off has been initiated; and determining each of said first and second switchover instants of a pulse-width-modulation clock period on a basis of an amplitude magnitude associated with the pulse-width-modulation clock period and calculated during a preceding pulse-width-modulation clock period, to thereby limit oscillation amplitudes of an oscillation of the output signal.

\* \* \* \* \*